United States Patent
Kim et al.

(10) Patent No.: US 9,633,706 B1
(45) Date of Patent: Apr. 25, 2017

(54) VOLTAGE SELF-BOOSTING CIRCUIT FOR GENERATING A BOOSTED VOLTAGE FOR DRIVING A WORD LINE WRITE IN A MEMORY ARRAY FOR A MEMORY WRITE OPERATION

(71) Applicant: QUALCOMM Incorporated, San Diego, CA (US)

(72) Inventors: Sungryul Kim, San Diego, CA (US); Jung Pill Kim, San Diego, CA (US); Hyunsuk Shin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/289,495

(22) Filed: Oct. 10, 2016

(51) Int. Cl.
  *G11C 11/14* (2006.01)
  *G11C 11/16* (2006.01)

(52) U.S. Cl.
  CPC ...... *G11C 11/1657* (2013.01); *G11C 11/1673* (2013.01); *G11C 11/1675* (2013.01); *G11C 11/1693* (2013.01); *G11C 11/1697* (2013.01)

(58) Field of Classification Search
  CPC ............ G11C 11/16; G11C 11/14; G11C 11/1673–11/1675; G11C 11/161; G11C 11/1653–11/1657; G11C 8/08; G11C 15/02; G11C 15/04; G11C 15/046
  See application file for complete search history.

(56) References Cited

U.S. PATENT DOCUMENTS

| 7,018,725 | B2 | 3/2006 | Odagawa et al. | |
|---|---|---|---|---|
| 7,468,914 | B2 | 12/2008 | Toda | |
| 7,782,661 | B2 | 8/2010 | Yang | |
| 8,724,373 | B2 | 5/2014 | Garg et al. | |
| 2013/0322167 | A1* | 12/2013 | Krebs | G11C 13/0004 365/163 |
| 2014/0241101 | A1* | 8/2014 | Wu | G11C 16/08 365/230.06 |
| 2015/0009745 | A1* | 1/2015 | Nguyen | G11C 13/004 365/148 |
| 2015/0036426 | A1 | 2/2015 | Kwak et al. | |
| 2016/0035403 | A1* | 2/2016 | Antonyan | G11C 11/1675 365/158 |
| 2016/0078912 | A1* | 3/2016 | Liu | G11C 11/16 365/158 |

* cited by examiner

*Primary Examiner* — Hien Nguyen
(74) *Attorney, Agent, or Firm* — Withrow & Terranova, PLLC

(57) ABSTRACT

A voltage self-boosting circuit for generating a boosted voltage for driving a word line write in a memory array for a memory write operation is provided. A voltage generation circuit(s) is configured to generate a read voltage for a memory read operation and a write voltage for a memory write operation based on a predefined supply voltage. For the memory write operation, a delay circuit delays the delay circuit enable signal by a predetermined delay to generate the output voltage control signal. Accordingly, the voltage generation circuit(s) generates boosted voltage that drives the write voltage to a selected word line(s). For the memory read operation, the voltage generation circuit(s) does not generate the boosted voltage and thus drives the read voltage to the selected word line(s). Hence, it is possible to reduce power consumption and timing delay during the memory read operation or the memory write operation.

23 Claims, 9 Drawing Sheets

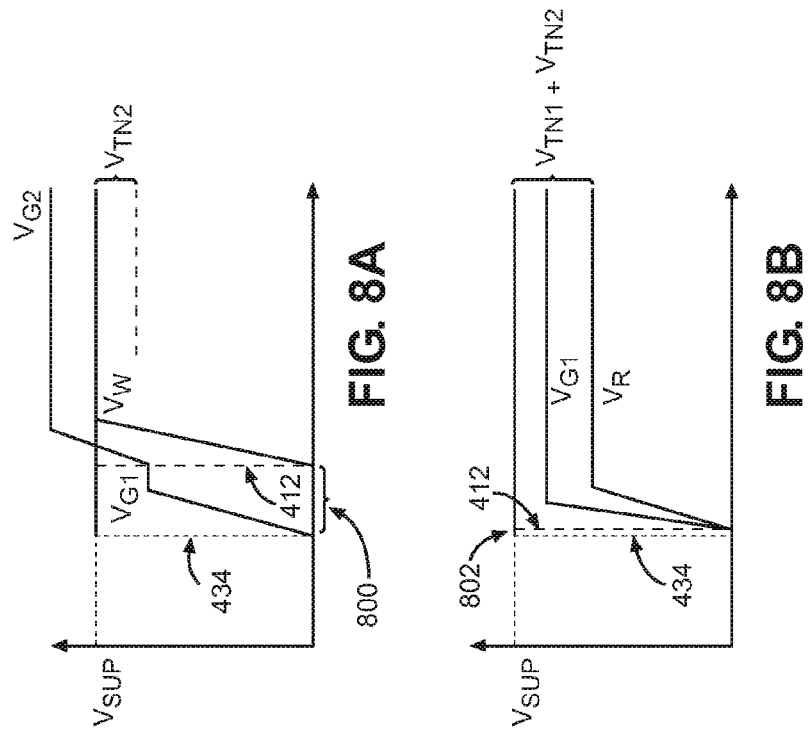
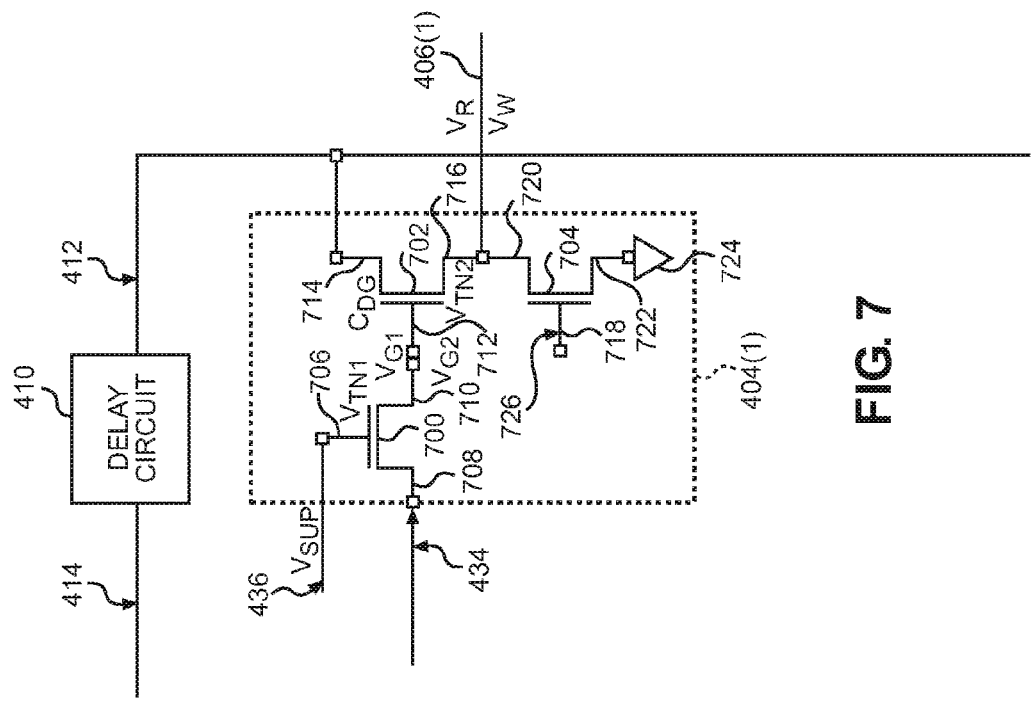

VOLTAGE SELF-BOOSTING CIRCUIT FOR GENERATING A BOOSTED VOLTAGE FOR DRIVING A WORD LINE WRITE IN A MEMORY ARRAY FOR A MEMORY WRITE OPERATION

BACKGROUND

I. Field of the Disclosure

The technology of the disclosure relates generally to memory systems for processor-based systems, and more particularly to generating read and write voltages for memory read and write operations to magneto-resistive memory.

II. Background

Semiconductor storage devices are used in integrated circuits (ICs) in electronic devices to provide data storage. One example of a semiconductor storage device is magneto-resistive random access memory (MRAM). MRAM is one of the prominent candidates for emerging non-volatile memory solutions. MRAM is non-volatile memory (NVM) in which data is stored by programming a magnetic tunnel junction (MTJ) as part of an MRAM bit cell. One advantage of an MRAM is that MTJs in MRAM bit cells can retain stored information even when power is turned off. This is because data is stored in the MTJ as a small magnetic element rather than as an electric charge or current.

In this regard, an MTJ comprises a free ferromagnetic layer ("free layer") disposed above or below a fixed or pinned ferromagnetic layer ("pinned layer"). The free and pinned layers are separated by a tunnel junction or barrier formed by a thin non-magnetic dielectric layer. The magnetic orientation of the free layer can be changed, but the magnetic orientation of the pinned layer remains fixed or "pinned." Data can be stored in the MTJ according to the magnetic orientation between the free and pinned layers. When the magnetic orientations of the free and pinned layers are anti-parallel (AP) to each other, a first memory state exists (e.g., a logical '1'). When the magnetic orientations of the free and pinned layers are parallel (P) to each other, a second memory state exists (e.g., a logical '0'). The magnetic orientations of the free and pinned layers can be sensed to read data stored in the MTJ by sensing a resistance when current flows through the MTJ. Data can also be written and stored in the MTJ by applying a magnetic field to change the orientation of the free layer to either a P or AP magnetic orientation with respect to the pinned layer.

Recent developments in MTJ devices involve spin torque transfer (STT)-MRAM devices. In STT-MRAM devices, the spin polarization of carrier electrons, rather than a pulse of a magnetic field, is used to program the state stored in the MTJ (i.e., a '0' or a '1'). FIG. 1 below illustrates an STT-MTJ 100. The STT-MTJ 100 is provided as part of an MRAM bit cell 102 to store non-volatile data. A metal-oxide semiconductor (typically n-type MOS, i.e., NMOS) access transistor 104 is provided to control reading and writing to the STT-MTJ 100. A drain (D) of the access transistor 104 is coupled to a bottom electrode 106 of the STT-MTJ 100, which is coupled to a pinned layer 108 for example. A word line (WL) is coupled to a gate (G) of the access transistor 104. A source (S) of the access transistor 104 is coupled to a voltage source ($V_S$) through a source line (SL). The voltage source ($V_S$) provides a voltage ($V_{SL}$) on the source line (SL). A bit line (BL) is coupled to a top electrode 110 of the STT-MTJ 100, which is coupled to a free layer 112 for example. The pinned layer 108 and the free layer 112 are separated by a tunnel barrier 114.

With continuing reference to FIG. 1, when writing data to the STT-MTJ 100, the gate (G) of the access transistor 104 is activated by activating the word line (WL). A voltage differential between a voltage ($V_{BL}$) on the bit line (BL) and the voltage ($V_{SL}$) on the source line (SL) is applied. As a result, a write current (I) is generated between the drain (D) and the source (S) of the access transistor 104. If the magnetic orientation of the STT-MTJ 100 in FIG. 1 is to be changed from AP to P, a write current ($I_{AP-P}$) flowing from the free layer 112 to the pinned layer 108 is generated. This induces a spin torque transfer (STT) at the free layer 112 to change the magnetic orientation of the free layer 112 to P with respect to the pinned layer 108. If the magnetic orientation is to be changed from P to AP, a current ($I_{P-AP}$) flowing from the pinned layer 108 to the free layer 112 is produced, which induces an STT at the free layer 112 to change the magnetic orientation of the free layer 112 to AP with respect to the pinned layer 108.

One obstacle to the success of MRAM is the need to provide comparably high current for write operations to switch the magnetization state of MTJs. This requirement is conventionally satisfied by driving a high voltage across the MTJ in an MRAM bit cell. One technique to boost current through an MRAM bit cell is to drive an excess voltage on word lines (WL) ("WL voltage") that drives the gate voltage of access transistors of the MRAM bit cells to increase the gate voltage of the access transistors, and thus increase switching current. However, high WL voltage can negatively affect the reliability of the access transistors in the MRAM, which then makes the MRAM bit cell vulnerable to reliability problems. For example, a high WL voltage can damage the gate oxide of the access transistors.

SUMMARY OF THE DISCLOSURE

Aspects disclosed in the detailed description include a voltage self-boosting circuit for generating a boosted voltage for driving a word line write in a memory array for a memory write operation. In this regard, a word line voltage generation system is provided in a memory system. The word line voltage generation system is configured to drive a word line voltage (e.g., a read voltage or a write voltage) on a selected word line(s) for a memory access operation (e.g., a memory read operation or a memory write operation). The word line voltage generation system includes a voltage generation circuit(s) configured to generate the word line voltage based on a predefined supply voltage. To mitigate the effect of the word line voltage generation system maintaining a higher write voltage that can negatively affect reliability of access transistors associated with the selected word line, the word line voltage generation system is configured to generate a lower read voltage for a memory read operation and the higher write voltage for a memory write operation. To avoid the need to provide a switching power supply, which can consume increased area and switching power, to be able to switch between the higher write voltage and the lower read voltage for the memory write operation and the memory read operation, respectively, the word line voltage generation system includes a delay circuit configured to provide an output voltage control signal to the voltage generation circuit(s) in response to receiving a delay circuit enable signal.

The delay circuit causes the voltage generation circuit(s) to switch between generating the higher write voltage and the lower read voltage on the selected word line by controlling an amount of delay between receiving the delay circuit enable signal and generating the output voltage control signal. In one aspect, for the memory write operation, the delay circuit delays the delay circuit enable signal by a predetermined delay to generate the output voltage control signal. Accordingly, the voltage generation circuit(s) generates boosted voltage that drive the higher write voltage to the selected word line(s) for the memory write operation. In another aspect, for the memory read operation, the voltage generation circuit(s) does not generate the boosted voltage and thus drives the lower read voltage to the selected word line(s). By generating the higher write voltage and the lower read voltage based on the output voltage control signal, it is possible to switch between generating the higher write voltage and the lower read voltage without requiring the switching power supply, thus reducing power consumption and timing delay associated with the memory read operation or the memory write operation.

In this regard in one aspect, a word line voltage generation system for driving a word line of a memory row in a memory array for memory accesses is provided. The word line voltage generation system comprises a delay circuit. The delay circuit is configured to receive a command signal indicating a memory read operation or a memory write operation for a memory access operation. The delay circuit is also configured to receive a delay circuit enable signal in response to decoding a row address of a selected word line in the memory array for the memory read operation or the memory write operation. The delay circuit is also configured to delay the delay circuit enable signal by a predetermined delay in response to the command signal indicating the memory write operation. The delay circuit is also configured to generate an output voltage control signal based on the delay circuit enable signal. The word line voltage generation system also comprises a voltage generation circuit. The voltage generation circuit is configured to receive a voltage supply signal corresponding to a predefined supply voltage. The voltage generation circuit is also configured to receive a decoded row address signal identifying the selected word line for the memory read operation or the memory write operation. The voltage generation circuit is also configured to receive the output voltage control signal from the delay circuit. The voltage generation circuit is also configured to generate a read voltage based on the predefined supply voltage on the selected word line in response to not receiving the output voltage control signal after receiving the decoded row address signal. The voltage generation circuit is also configured to generate a write voltage higher than the read voltage based on the predefined supply voltage on the selected word line in response to receiving the output voltage control signal after receiving the decoded row address signal.

In another aspect, a method for driving a word line of a memory row in a memory array for memory accesses is provided. The method comprises receiving a command signal indicating a memory read operation or a memory write operation for a memory access operation. The method also comprises receiving a delay circuit enable signal in response to decoding a row address of a selected word line in the memory array for the memory read operation or the memory write operation. The method also comprises delaying the delay circuit enable signal by a predetermined delay in response to the command signal indicating the memory write operation. The method also comprises generating an output voltage control signal based on the delay circuit enable signal. The method also comprises receiving a voltage supply signal corresponding to a predefined supply voltage. The method also comprises receiving a decoded row address signal identifying the selected word line for the memory read operation or the memory write operation. The method also comprises receiving the output voltage control signal. The method also comprises generating a read voltage based on the predefined supply voltage on the selected word line in response to not receiving the output voltage control signal after receiving the decoded row address signal. The method also comprises generating a write voltage higher than the read voltage based on the predefined supply voltage on the selected word line in response to receiving the output voltage control signal after receiving the decoded row address signal.

In another aspect, a memory system is provided. The memory system comprises a memory array comprising a plurality of memory bit cells organized into a plurality of rows respectively addressed by a plurality of word lines and a plurality of columns respectively addressed by a plurality of bit lines and a plurality of source lines. The memory system also comprises a word line voltage generation system. The word line voltage generation system comprises a delay circuit. The delay circuit is configured to receive a command signal indicating a memory read operation or a memory write operation for a memory access operation. The delay circuit is also configured to receive a delay circuit enable signal in response to decoding a row address of a selected word line among the plurality of word lines for the memory read operation or the memory write operation. The delay circuit is also configured to delay the delay circuit enable signal by a predetermined delay in response to the command signal indicating the memory write operation. The delay circuit is also configured to generate an output voltage control signal based on the delay enable signal. The word line voltage generation system also comprises a plurality of voltage generation circuits, each configured to receive a voltage supply signal corresponding to a predefined supply voltage. The voltage generation circuit is also configured to receive a decoded row address signal identifying the selected word line for the memory read operation or the memory write operation. The voltage generation circuit is also configured to receive the output voltage control signal from the delay circuit. The voltage generation circuit is also configured to generate a read voltage based on the predefined supply voltage on the selected word line in response to not receiving the output voltage control signal after receiving the decoded row address signal. The voltage generation circuit is also configured to generate a write voltage higher than the read voltage based on the predefined supply voltage on the selected word line in response to receiving the output voltage control signal after receiving the decoded row address signal.

BRIEF DESCRIPTION OF THE FIGURES

FIG. 7 is a schematic diagram providing an exemplary illustration of a voltage generation circuit in the word line voltage generation system of FIG. 4 configured to drive the read voltage and the write voltage to the selected word line(s) for the memory read operation and the memory write operation, respectively;

FIG. 8A is a schematic diagram providing an exemplary illustration of the voltage generation circuit of FIG. 7 configured to boost the write voltage for the memory write operation;

FIG. 8B is a schematic diagram providing an exemplary illustration of the voltage generation circuit of FIG. 7 configured to generate the read voltage lower than the predefined supply voltage of FIG. 4 for the memory read operation;

DETAILED DESCRIPTION

Figure 1:
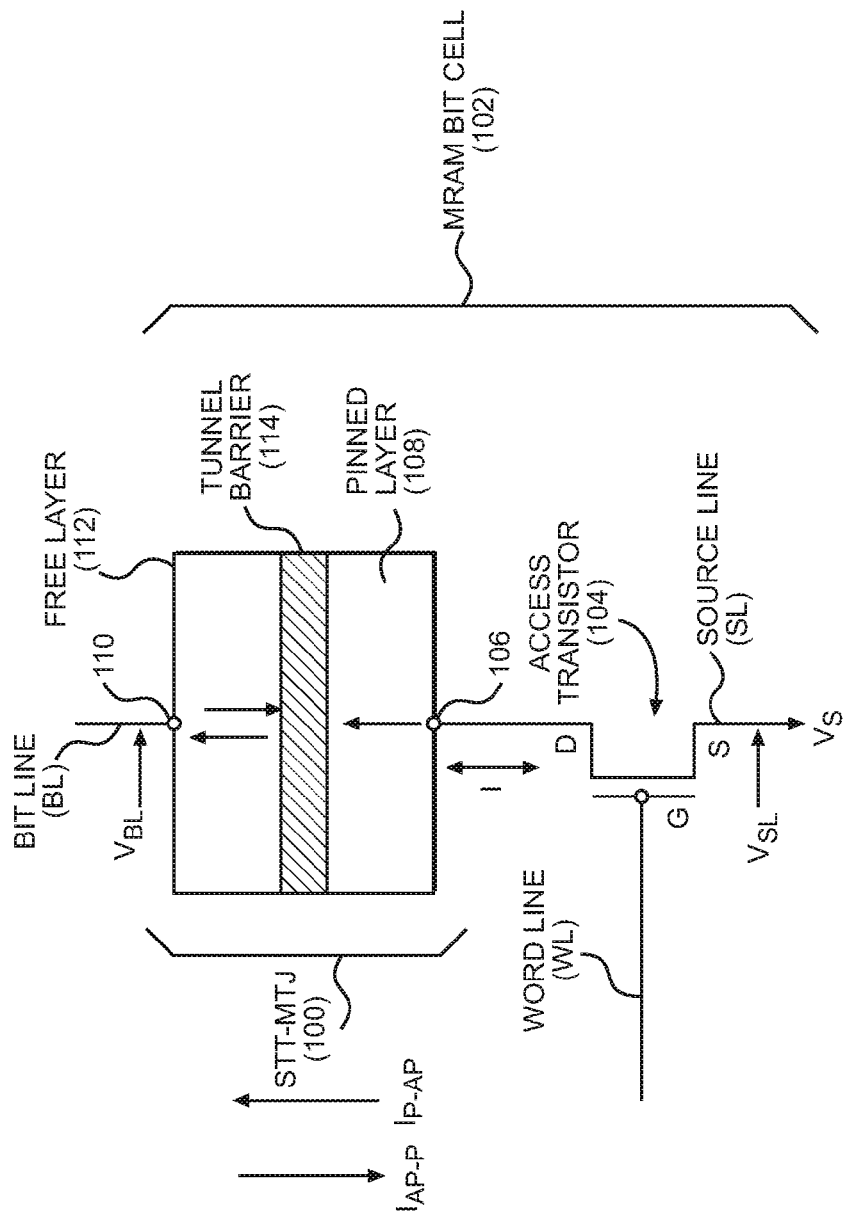
FIG. 1 is a schematic diagram of an exemplary spin torque transfer (STT)-magnetic tunnel junction (MTJ) (STT-MTJ) that forms a bit cell(s) in a magnetic random access memory (MRAM) array.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a voltage self-boosting circuit for generating a boosted voltage for driving a word line write in a memory array for a memory write operation. In this regard, a word line voltage generation system is provided in a memory system. The word line voltage generation system is configured to drive a word line voltage (e.g., a read voltage or a write voltage) on a selected word line(s) for a memory access operation (e.g., a memory read operation or a memory write operation). The word line voltage generation system includes a voltage generation circuit(s) configured to generate the word line voltage based on a predefined supply voltage. To mitigate the effect of the word line voltage generation system maintaining a higher write voltage that can negatively affect reliability of access transistors associated with the selected word line, the word line voltage generation system is configured to generate a lower read voltage for a memory read operation and the higher write voltage for a memory write operation. To avoid the need to provide a switching power supply, which can consume increased area and switching power, to be able to switch between the higher write voltage and the lower read voltage for the memory write operation and the memory read operation, respectively, the word line voltage generation system includes a delay circuit configured to provide an output voltage control signal to the voltage generation circuit(s) in response to receiving a delay circuit enable signal.

The delay circuit causes the voltage generation circuit(s) to switch between generating the higher write voltage and the lower read voltage on the selected word line by controlling an amount of delay between receiving the delay circuit enable signal and generating the output voltage control signal. In one aspect, for the memory write operation, the delay circuit delays the delay circuit enable signal by a predetermined delay to generate the output voltage control signal. Accordingly, the voltage generation circuit(s) generates boosted voltage that drive the higher write voltage to the selected word line(s) for the memory write operation. In another aspect, for the memory read operation, the voltage generation circuit(s) does not generate the boosted voltage and thus drives the lower read voltage to the selected word line(s). By generating the higher write voltage and the lower read voltage based on the output voltage control signal, it is possible to switch between generating the higher write voltage and the lower read voltage without requiring the switching power supply, thus reducing power consumption and timing delay associated with the memory read operation or the memory write operation.

Figure 2:
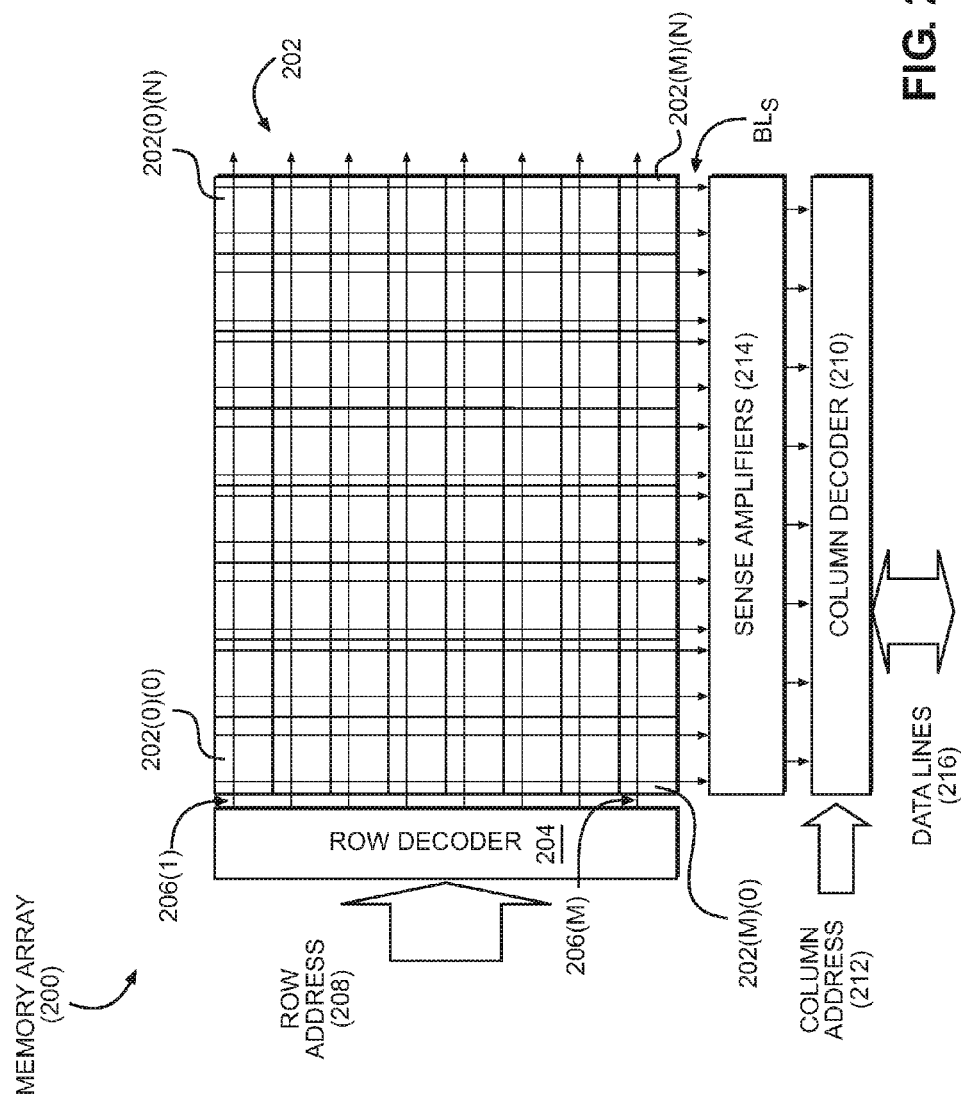
FIG. 2 is a schematic diagram of an exemplary MRAM memory system that includes an MRAM array comprising a plurality of MRAM bit cells and supporting access circuitry for accessing the MRAM bit cells.

Before discussing exemplary aspects of a voltage self-boosting circuit to generate a boosted voltage for driving a write voltage to a word line for a memory write operation to a memory array that includes specific aspects of the present disclosure, a brief overview of a magnetic random access memory (MRAM) array with supporting access circuitry is first provided in reference to FIG. 2. A brief discussion of a word line voltage generation system for driving a read voltage for a memory read operation and a write voltage higher than the read voltage for a memory write operation to a selected word line in the MRAM array of FIG. 2 is then provided in reference to FIG. 3. The discussion of specific exemplary aspects of a voltage self-boosting circuit to generate a boosted voltage for driving a write voltage to a word line for a memory write operation to a memory array starts with reference to FIG. 4.

In this regard, FIG. 2 is a schematic diagram of an MRAM array 200. The MRAM array 200 includes a plurality of memory bit cells 202 organized in 'M' rows and 'N' columns, thus provided as memory bit cells 202(0)(0)-202(M)(N). In a non-limiting example, the memory bit cells 202(0)(0)-202(M)(N) include spin torque transfer (STT)-magnetic tunnel junction (MTJ) devices. The MRAM array 200 also includes dedicated supporting circuitry to facilitate performing read and write operations to the memory bit cells 202(0)(0)-202(M)(N) in the MRAM array 200. For example, the MRAM array 200 includes a row decoder 204 configured to assert a word line among a plurality of word lines 206(1)-206(M) to select a row of the memory bit cells 202(0)(0)-202(M)(N) in the MRAM array 200 based on a row address 208. The MRAM array 200 also includes a column decoder 210 configured to select a column of the memory bit cells 202(0)(0)-202(M)(N) in the MRAM array 200 based on a column address 212. The memory bit cells 202(0)(0)-202(M)(N) accessed are those intersecting the selected row and column by the row decoder 204 and column decoder 210. In a read operation, sense amplifiers 214 sense (i.e., read) a storage state of the selected memory bit cells 202(0)(0)-202(M)(N) from their respective bit lines (BLs) to provide the read data from the selected memory bit cells 202(0)(0)-202(M)(N) onto data lines 216.

Higher current is required to switch magnetization states of the memory bit cells 202(0)(0)-202(M)(N) for write operations to the MRAM array 200. To provide the higher current for the memory write operations to the memory bit cells 202(0)(0)-202(M)(N), higher voltages are applied to the word lines 206(1)-206(M). However, applying the higher voltages on the word lines 206(1)-206(M) can negatively affect the reliability of the access transistors (not shown) in the memory bit cells 202(0)(0)-202(M)(N). For example, the higher voltages can cause permanent damage to the oxide layers in the access transistors, thus reducing reliability of the access transistors. Since conventionally, memory read operations to the memory bit cells 202(0)(0)-202(M)(N), which require that lower voltages be applied to the word lines 206(1)-206(M), are performed more often than the memory write operations, it may be desirable to only apply the higher voltages to the word lines 206(1)-206(M) during the memory write operations.

Figure 3:
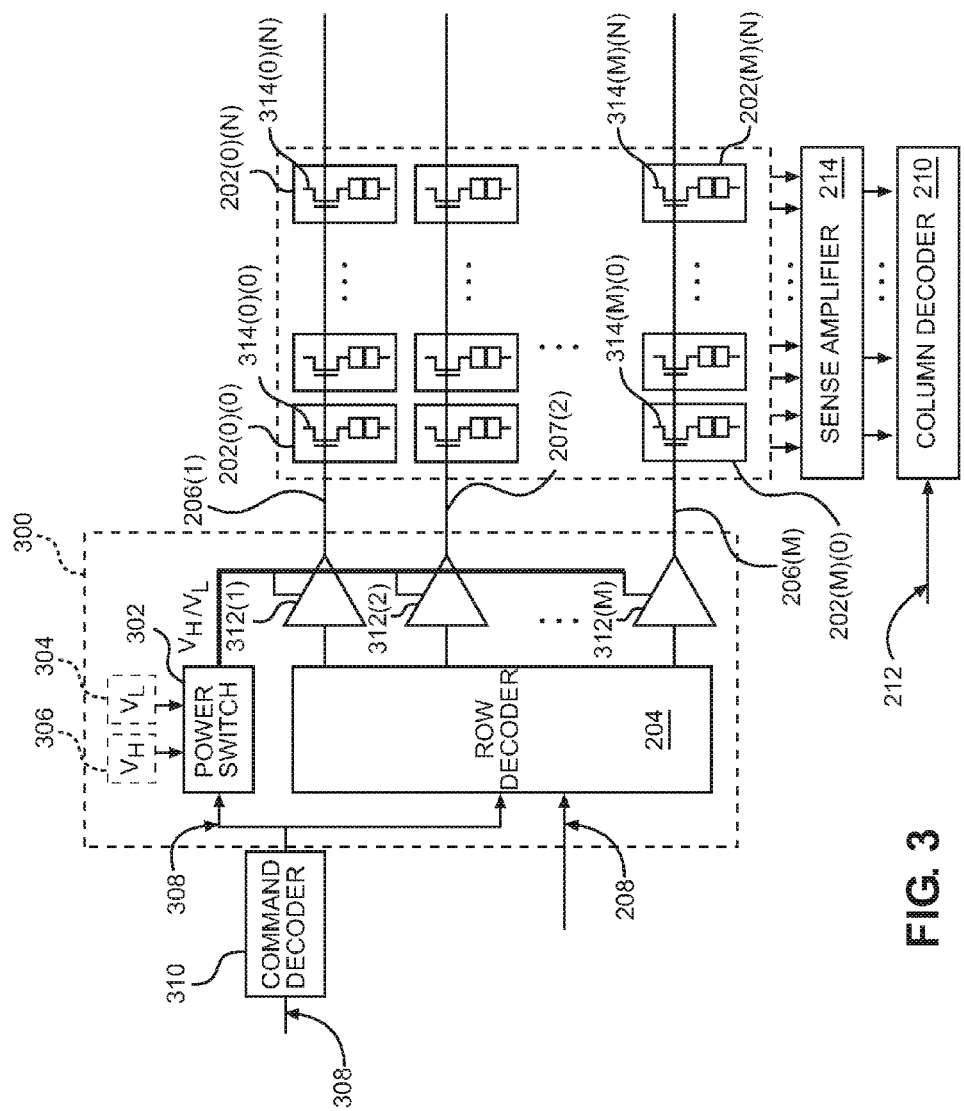
FIG. 3 is a schematic diagram of a word line voltage generation system for driving a read voltage for a memory read operation and a write voltage higher than the read voltage for a memory write operation to a selected word line in the MRAM array of FIG. 2.

In this regard, FIG. 3 is a schematic diagram of a word line voltage generation system 300 for driving a read voltage $V_L$ for a memory read operation and a write voltage $V_H$ ($V_H$>$V_L$) for a memory write operation to a selected word line among the word lines 206(1)-206(M) in the MRAM array 200 of FIG. 2. Common elements between FIGS. 2 and 3 are shown therein with common element numbers and will not be re-described herein.

With reference to FIG. 3, the word line voltage generation system 300 includes a power switch 302. The power switch 302 is coupled to a read voltage source 304 and a write voltage source 306 to receive the read voltage $V_L$ and the write voltage $V_H$, respectively. The power switch 302 is configured to receive a command signal 308 from a command decoder 310. The command signal 308 indicates a memory read operation or a memory write operation to be performed in one or more of the memory bit cells 202(0)(0)-202(M)(N).

The power switch 302 is coupled to the word lines 206(1)-206(M) via a plurality of word line drivers 312(1)-312(M), respectively. The power switch 302 is driven by the command signal 308. In response to the command signal 308 indicating the memory read operation, the power switch 302 couples the read voltage source 304 to the word line drivers 312(1)-312(M) to provide the read voltage $V_L$ to the word lines 206(1)-206(M). In response to the command signal 308 indicating the memory write operation, the power switch 302 couples the write voltage source 306 to the word line drivers 312(1)-312(M) to provide the write voltage $V_H$ to the word lines 206(1)-206(M). In this regard, the word line voltage generation system 300 can drive the read voltage $V_L$ and the write voltage $V_H$ to the word lines 206(1)-206(M) for the memory read operation and the memory write operation. As such, the word line voltage generation system 300 can protect a plurality of access transistors 314(0)(0)-314(M)(N) in the memory bit cells 202(0)(0)-202(M)(N) from being exposed to the write voltage $V_H$, thus improving the reliability of the memory bit cells 202(0)(0)-202(M)(N).

However, the power switch 302 can consume excessive power to charge and discharge the word line drivers 312(1)-312(M) from the read voltage source 304 or the write voltage source 306. As such, the power switch 302 needs to be large enough to withstand the excessive power needed to drive the word line drivers 312(1)-312(M). As a result, the power switch 302 may require a larger layout area to be provided in the word line voltage generation system 300, thus leading to increased footprint of the word line voltage generation system 300. In addition, there is also a switching delay associated with switching between the memory read operation and the memory write operation due to voltage settling time associated with the read voltage source 304 and the write voltage source 306. Further, the read voltage source 304 and the write voltage source 306 can further increase the footprint and power consumption of the word line voltage generation system 300. Hence, it may be desirable to generate the read voltage $V_L$ and the write voltage $V_H$ from a single voltage source, while eliminating the power switch 302.

Figure 4:
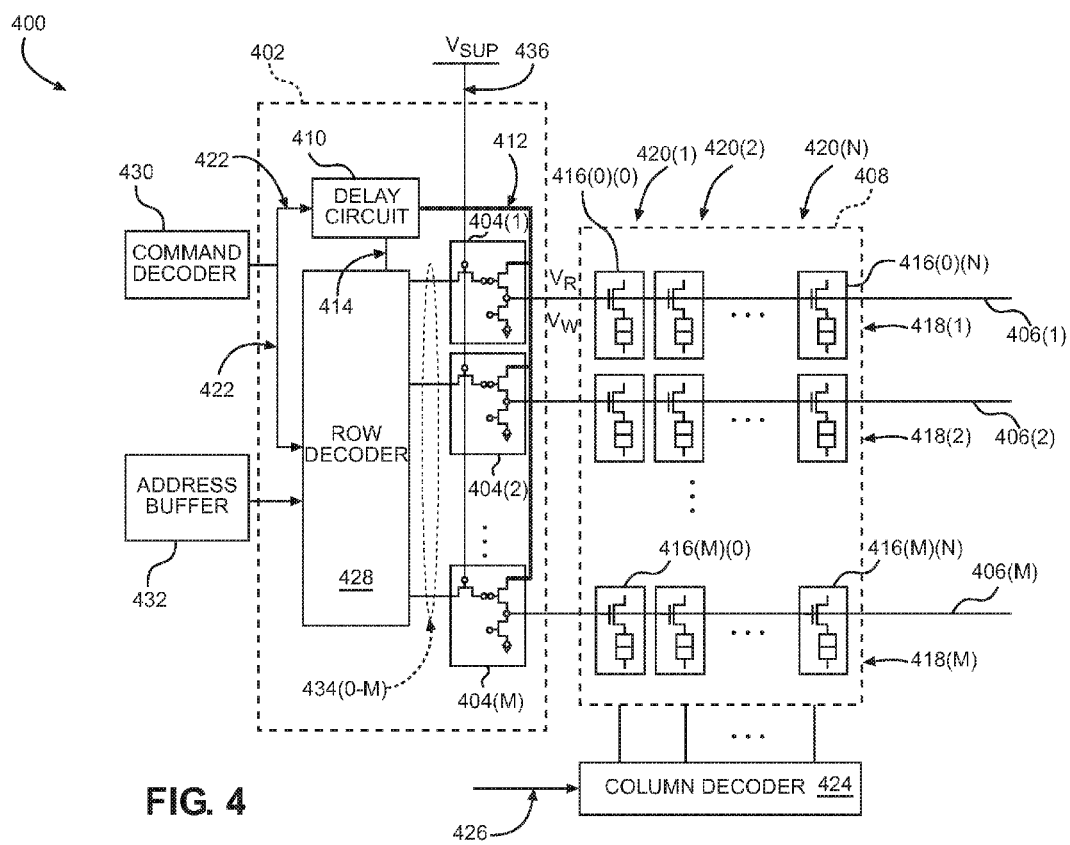
FIG. 4 is a schematic diagram of an exemplary memory system that includes a word line voltage generation system including a plurality of voltage generation circuits each configured to generate a boosted voltage for driving a write voltage to a selected word line(s) among a plurality of word lines in the memory system for a memory write operation to a memory array.

In this regard, FIG. 4 is a schematic diagram of an exemplary memory system 400 having a word line voltage generation system 402 that includes a plurality of voltage generation circuits 404(1)-404(M) each configured to generate a boosted voltage for driving a write voltage $V_W$ to a selected word line(s) among a plurality of word lines 406(1)-406(M) in the memory system 400 for a memory write operation to a memory array 408. Each of the voltage generation circuits 404(1)-404(M) in word line voltage generation system 402 is configured to drive a read voltage $V_R$ for a memory read operation and the write voltage $V_W$ higher than the read voltage $V_R$ for the memory write operation from a predefined supply voltage $V_{SUP}$ to the selected word line(s) among the word lines 406(1)-406(M).

The word line voltage generation system 402 includes a delay circuit 410 configured to provide an output voltage control signal 412 to the voltage generation circuits 404(1)-404(M) in response to receiving a delay circuit enable signal 414. The delay circuit 410 causes the voltage generation circuits 404(1)-404(M) to switch between generating the read voltage $Y_R$ for the memory read operation and the write voltage $V_W$ higher than the read voltage $Y_R$ for the memory write operation by controlling an amount of delay between receiving the delay circuit enable signal 414 and generating the output voltage control signal 412. In one aspect, for the memory write operation, the delay circuit 410 delays the delay circuit enable signal 414 by a predetermined delay to generate the output voltage control signal 412. In this regard, the output voltage control signal 412 is delayed from the delay circuit enable signal 414 by at least one predetermined delay. Accordingly, the voltage generation circuits 404(1)-404(M) generate boosted voltage that drives the write voltage $V_W$ to the selected word line(s) for the memory write operation. In another aspect, for the memory read operation, the delay circuit 410 generates the output voltage control signal 412 based on the delay circuit enable signal 414. In this regard, the delay circuit 410 may generate the output voltage control signal 412 without delaying the delay circuit enable signal 414. Alternatively, the delay circuit 410 may delay the delay circuit enable signal 414 by less than the predetermined delay to generate the output voltage control signal 412. Accordingly, the voltage generation circuits 404(1)-404(M) do not generate the boosted voltage and thus drive the read voltage $Y_R$ to the selected word line(s) for the memory read operation. By generating the write voltage $V_W$ and the read voltage $Y_R$ based on the delays in the output voltage control signal 412, it is possible to switch the voltage generation circuits 404(1)-404(M) between generating the write voltage $V_W$ and the read voltage $Y_R$ without requiring the power switch 302 of FIG. 3, thus reducing power consumption and timing delay associated with the memory read operation or the memory write operation in the memory system 400.

With continuing reference to FIG. 4, the memory array 408 includes a plurality of memory bit cells 416(0)(0)-416(M)(N) organized into a plurality of rows 418(1)-418(M) and a plurality of columns 420(1)-420(N). In a non-limiting example, the memory array 408 is an MRAM array and each of the memory bit cells 416(0)(0)-416(M)(N) is an STT-MTJ bit cell. The rows 418(1)-418(M) are respectively controlled by the word lines 406(1)-406(M).

The voltage generation circuits 404(1)-404(M) are configured to drive the read voltage $Y_R$ and the write voltage $V_W$ to the word lines 406(1)-406(M), respectively. The delay circuit 410 receives a command signal 422 indicating the memory read operation or the memory write operation. The delay circuit 410 also receives the delay circuit enable signal 414 in response to decoding a row address of a selected word line in the memory array 408 for the memory read operation and the memory write operation indicated by the command signal 422. The delay circuit 410 is configured to generate and provide the output voltage control signal 412 to the voltage generation circuits 404(1)-404(M) in response to receiving the command signal 422 and the delay circuit enable signal 414. In a non-limiting example, the delay circuit 410 generates the output voltage control signal 412 after a predetermined delay from receiving the delay circuit enable signal 414 in response to the command signal 422 indicating the memory write operation. In contrast, the delay circuit 410 generates the output voltage control signal 412 before the predetermined delay from receiving the delay circuit enable signal 414 in response to the command signal 422 indicating the memory read operation. The predetermined delay, for example, can be approximately one nanosecond (1 ns). In this regard, by examining whether the delay associated with the output voltage control signal 412 is greater than the predetermined delay, the word line voltage generation system 402 can determine whether to generate the write voltage $V_W$ and the read voltage $Y_R$ for the selected word line in the memory array 408. As a result, it is possible to eliminate the power switch 302 of FIG. 3, thus helping to reduce footprint and latency of the word line voltage generation system 402.

Further, each of the voltage generation circuits 404(1)-404(M) is configured to generate the read voltage $Y_R$ and the write voltage $V_W$ for the selected word line in the memory array 408 based on the predefined supply voltage $V_{SUP}$. Aspects related to generating the read voltage $Y_R$ and the write voltage $V_W$ for the selected word line in the memory array 408 based on the predefined supply voltage $V_{SUP}$ will be further discussed later in FIGS. 7 and 8A-8B. By generating the read voltage $Y_R$ and the write voltage $V_W$ based on the predefined supply voltage $V_{SUP}$, as opposed to using the read voltage source 304 and the write voltage source 306 of FIG. 3, it is possible to further reduce footprint as well as power consumption of the word line voltage generation system 402.

With continuing reference to FIG. 4, the memory system 400 includes a column decoder 424 configured to select a column among the columns 420(1)-420(N) in the memory array 408 based on a column address 426. The word line voltage generation system 402 includes a row decoder 428 coupled to the delay circuit 410 and the voltage generation circuits 404(1)-404(M). The row decoder 428 also receives the command signal 422 indicating the memory read operation or the memory write operation. In a non-limiting example, a command decoder 430 is configured to provide the command signal 422 substantially concurrently to the delay circuit 410 and the row decoder 428. The row decoder 428 further receives the row address of the selected word line in the memory array 408 from an address buffer 432. The row decoder 428 generates a plurality of decoded row address signals 434(0-M). One of the decoded row address signals 434(0-M) identifies the selected word line based on the received row address, and is hereinafter referred to as the decoded row address signal 434. The row decoder 428 then provides the delay circuit enable signal 414 and the decoded row address signal 434 substantially concurrently to the delay circuit 410 and the voltage generation circuit coupled to the selected word line, respectively. In a non-limiting example, the row decoder 428 provides the decoded row address signal 434 to the delay circuit 410 as the delay circuit enable signal 414. Because the delay circuit enable signal 414 is provided substantially concurrent with the decoded row address signal 434, the delay between the delay circuit enable signal 414 and the output voltage control signal 412 can be treated as being substantially equal to the delay between the decoded row address signal 434 and the output voltage control signal 412.

For the convenience of reference and illustration, the word line 406(1) and the corresponding voltage generation circuit 404(1) are discussed hereinafter as non-limiting examples. In this regard, the word line 406(1) is hereinafter referred to as the selected word line 406(1), which is identified by the decoded row address signal 434. Accordingly, the voltage generation circuit 404(1) is configured to receive the decoded row address signal 434 from the row decoder 428. It shall be appreciated that the operation principles discussed with reference to the word line 406(1) and the voltage generation circuit 404(1) are applicable to rest of the word lines 406(2)-406(M) and voltage generation circuits 404(2)-404(M) as well.

With continuing reference to FIG. 4, the voltage generation circuit 404(1) receives a voltage supply signal 436 corresponding to the predefined supply voltage $V_{SUP}$. The voltage generation circuit 404(1) also receives the decoded row address signal 434 identifying the selected word line 406(1) for the memory read operation and the memory write operation from the row decoder 428. The voltage generation circuit 404(1) also receives the output voltage control signal 412 from the delay circuit 410. The voltage generation circuit 404(1) is configured to generate the write voltage $V_W$ based on the predefined supply voltage $V_{SUP}$ on the selected word line 406(1) in response to receiving the output voltage control signal 412 after receiving the decoded row address signal 434. In a non-limiting example, the voltage generation circuit 404(1) is configured to generate the write voltage $V_W$ based on the predefined supply voltage $V_{SUP}$ on the selected word line 406(1) in response to receiving the output voltage control signal 412 after the predetermined delay from receiving the decoded row address signal 434. In this regard, the output voltage control signal 412 is delayed from the decoded row address signal 434 by at least the predetermined delay. In contrast, the voltage generation circuit 404(1) is configured to generate the read voltage $V_R$ based on the predefined supply voltage $V_{SUP}$ on the selected word line 406(1) in response to not receiving the output voltage control signal 412 after receiving the decoded row address signal 434. In a non-limiting example, the voltage generation circuit 404(1) can be configured to generate the read voltage $V_R$ based on the predefined supply voltage $V_{SUP}$ on the selected word line 406(1) in response to not receiving the output voltage control signal 412 after the predetermined delay from receiving the decoded row address signal 434. In this regard, the output voltage control signal 412 is delayed from the decoded row address signal 434 by less than the predetermined delay. In another non-limiting example, the voltage generation circuit 404(1) can be configured to drive the read voltage $V_R$ to the selected word line 406(1) in response to receiving the output voltage control signal 412 substantially concurrently with receiving the decoded row address signal 434.

As discussed above, the word line voltage generation system 402 can drive the read voltage $V_R$ and the write voltage $V_W$ to the selected word line 406(1) based on the predefined supply voltage $V_{SUP}$ and according to the delay generated by the delay circuit 410 in the output voltage control signal 412. As such, it is possible to eliminate the power switch 302, the read voltage source 304, and the write voltage source 306 of FIG. 3 from the word line voltage generation system 402. As a result, the word line voltage generation system 402 can be provided with reduced footprint, latency, and/or power consumption compared to the word line voltage generation system 300 of FIG. 3.

The word line voltage generation system 402 can be configured to drive the read voltage $V_R$ for the memory read operation and the write voltage $V_W$ for the memory write operation to the selected word line 406(1) based on a process. In this regard, FIG. 5 is a flowchart of an exemplary process 500 that can be employed by the word line voltage generation system 402 of FIG. 4 to generate the boosted voltage for driving the write voltage $V_W$ to the selected word line 406(1) for the memory write operation to the memory array 408.

Figure 5:
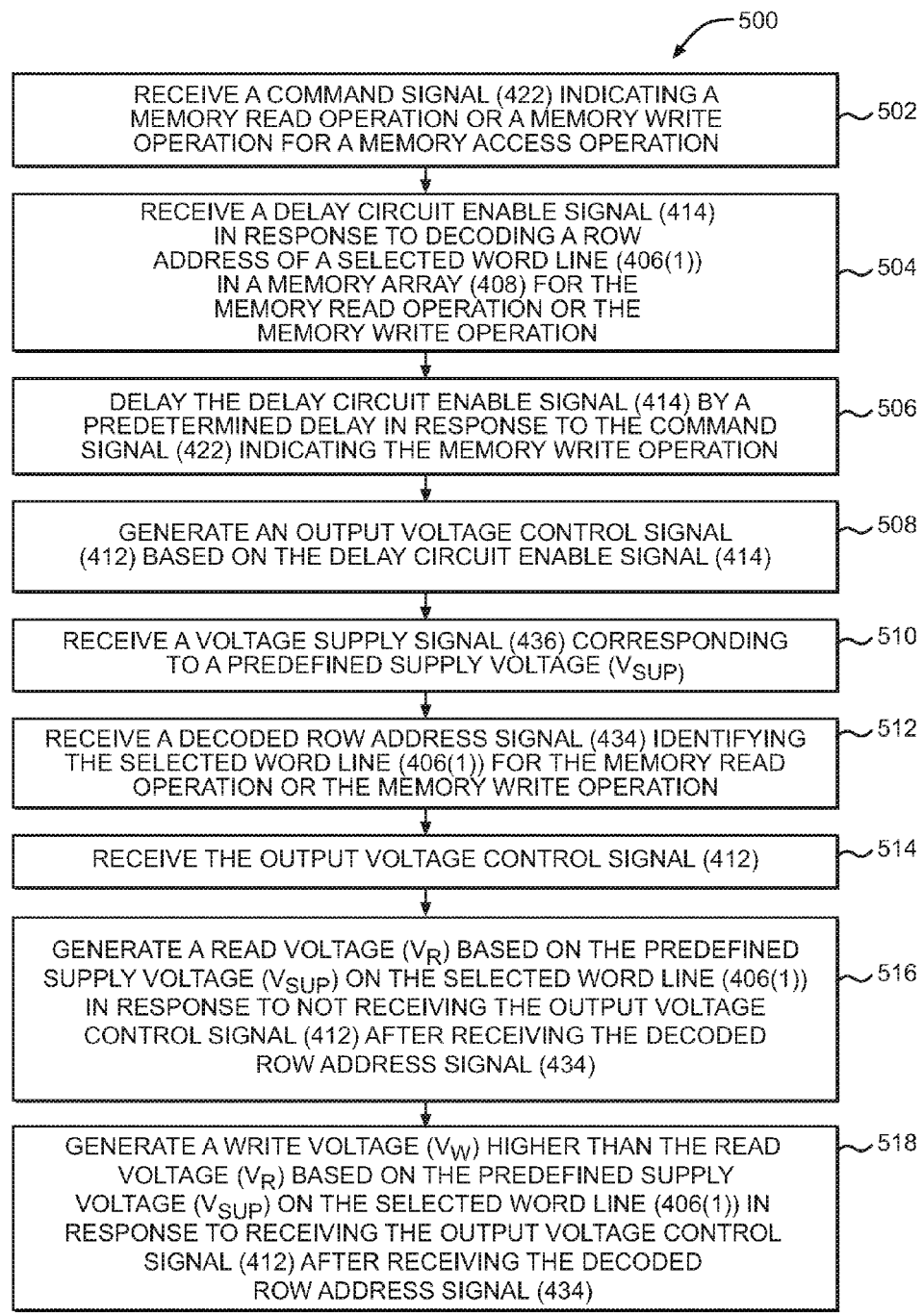
FIG. 5 is a flowchart of an exemplary process that can be employed by the word line voltage generation system of FIG. 4 to generate the boosted voltage for driving the write voltage to the selected word line(s) for the memory write operation to the memory array.

With reference to FIG. 5, the delay circuit 410 receives the command signal 422 indicating the memory read operation or the memory write operation for a memory access operation (block 502). The delay circuit 410 receives the delay circuit enable signal 414 in response to decoding the row address of the selected word line 406(1) in the memory array 408 for the memory read operation or the memory write operation (block 504). The delay circuit 410 delays the delay circuit enable signal 414 by the predetermined delay in response to the command signal 422 indicating the memory write operation (block 506). The delay circuit 410 generates the output voltage control signal 412 based on the delay circuit enable signal 414 (block 508).

With continuing reference to FIG. 5, the voltage generation circuit 404(1) receives the voltage supply signal 436 corresponding to the predefined supply voltage $V_{SUP}$ (block 510). The voltage generation circuit 404(1) receives the decoded row address signal 434 identifying the selected word line 406(1) for the memory read operation or the memory write operation (block 512). The voltage generation circuit 404(1) receives the output voltage control signal 412 (block 514). The voltage generation circuit 404(1) generates the read voltage $V_R$ based on the predefined supply voltage $V_{SUP}$ on the selected word line 406(1) in response to not receiving the output voltage control signal 412 after receiving the decoded row address signal 434 (block 516). The voltage generation circuit 404(1) generates the write voltage $V_W$ higher than the read voltage $Y_R$ based on the predefined supply voltage $V_{SUP}$ on the selected word line 406(1) in response to receiving the output voltage control signal 412 after receiving the decoded row address signal 434 (block 518).

Figure 6:
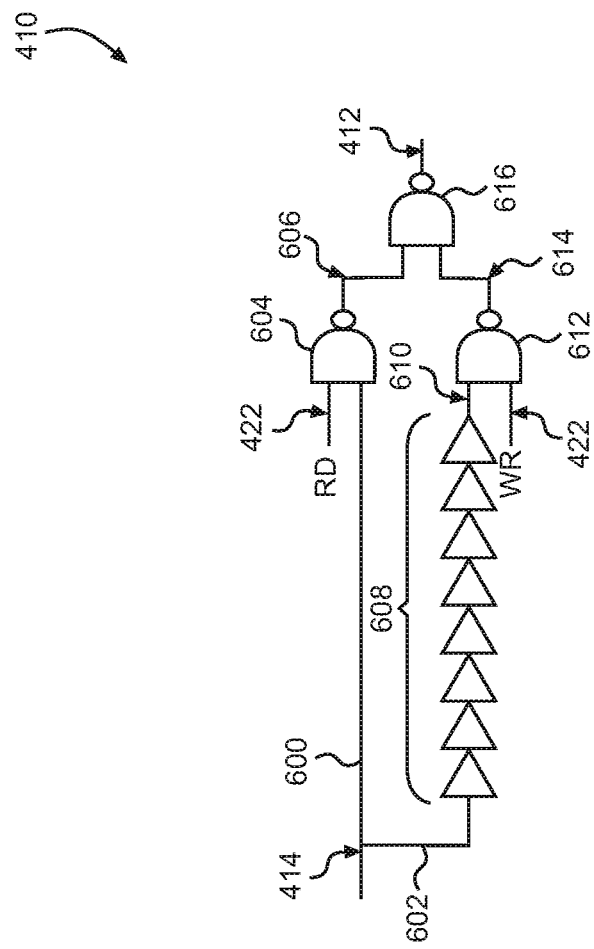
FIG. 6 is a schematic diagram providing an exemplary illustration of a delay circuit that can be provided in the word line voltage generation system of FIG. 4.

As discussed above, the delay circuit 410 generates the output voltage control signal 412 after the predetermined delay from receiving the delay circuit enable signal 414 for the memory write operation, while generating the output voltage control signal 412 before the predetermined delay from receiving the delay circuit enable signal 414 for the memory read operation. In this regard, FIG. 6 is a schematic diagram providing an exemplary illustration of the delay circuit 410 of FIG. 4. Common elements between FIGS. 4 and 6 are shown therein with common element numbers and will not be re-described herein.

With reference to FIG. 6, the delay circuit 410 includes a first signal path 600 and a second signal path 602. The first signal path 600 includes a first AND-based logic circuit 604, which can be a NAND logic circuit for example. The first AND-based logic circuit 604 is configured to receive the delay circuit enable signal 414 from the row decoder 428 (not shown) and the command signal 422 from the command decoder 430 (not shown). The first AND-based logic circuit 604 outputs a first output voltage control signal 606 based on the delay circuit enable signal 414 if the command signal 422 indicates the memory read operation.

The second signal path 602 includes one or more delay elements 608 configured to receive the delay circuit enable signal 414 from the row decoder 428. In a non-limiting example, the delay elements 608 are disposed according to a serial arrangement. The delay elements 608 are configured to delay the delay circuit enable signal 414 by the predetermined delay to generate a delayed delay circuit enable signal 610. The second signal path 602 includes a second AND-based logic circuit 612, which can be a NAND logic circuit for example. The second AND-based logic circuit 612 is coupled to the delay elements 608 to receive the delayed delay circuit enable signal 610. The second AND-based logic circuit 612 also receives the command signal 422 from the command decoder 430. The second AND-based logic circuit 612 outputs a second output voltage control signal 614 based on the delayed delay circuit enable signal 610 if the command signal 422 indicates the memory write operation.

The delay circuit 410 includes a third AND-based logic circuit 616, which can be a NAND logic circuit for example, coupled to the first AND-based logic circuit 604 and the second AND-based logic circuit 612. The third AND-based logic circuit 616 is configured to output the first output voltage control signal 606 or the second output voltage control signal 614 as the output voltage control signal 412. In this regard, the third AND-based logic circuit 616 outputs the first output voltage control signal 606 as the output voltage control signal 412 in response to the command signal 422 indicating the memory read operation. In contrast, the third AND-based logic circuit 616 outputs the second output voltage control signal 614 as the output voltage control signal 412 in response to the command signal 422 indicating the memory write operation.

According to previous discussions in FIG. 4, the voltage generation circuit 404(1) can drive the read voltage $Y_R$ and the write voltage $V_W$ to the selected word line 406(1) for the memory read operation and the memory write operation, respectively. Aspects related to the voltage generation circuit 404(1) are discussed next with references to FIGS. 7 and 8A-8B. It shall be appreciated that the operation principles discussed herein are applicable to the voltage generation circuits 404(2)-404(M) in the memory system 400 as well. Common elements between FIGS. 4, 7, and 8A-8B are shown therein with common element numbers and will not be re-described herein.

In this regard, FIG. 7 is a schematic diagram providing an exemplary illustration of the voltage generation circuit 404(1) of FIG. 4 configured to drive the read voltage $Y_R$ and the write voltage $V_W$ to the selected word line 406(1) for the memory read operation and the memory write operation, respectively. In a non-limiting example, the voltage generation circuit 404(1) includes a first n-type metal-oxide semiconductor (NMOS) transistor 700, a second NMOS transistor 702, and a third NMOS transistor 704. The first NMOS transistor 700 includes a first gate electrode 706, a first drain electrode 708, and a first source electrode 710. The first drain electrode 708 is configured to receive the decoded row address signal 434 from the row decoder 428. The first gate electrode 706 is configured to receive the voltage supply signal 436 corresponding to the predefined supply voltage $Y_{SUP}$. The first source electrode 710 is configured to output a first gate voltage $Y_{G1}$. In a non-limiting example, the first gate voltage $Y_{G1}$ is substantially equal to a difference between the predefined supply voltage $V_{SUP}$ and a first threshold voltage $V_{TN1}$ of the first NMOS transistor 700 ($V_{G1}=V_{SUP}-V_{TN1}$).

The second NMOS transistor 702 includes a second gate electrode 712, a second drain electrode 714, and a second source electrode 716. The second gate electrode 712 is coupled to the first source electrode 710 of the first NMOS transistor 700 to receive the first gate voltage $V_{G1}$. The second drain electrode 714 is configured to receive the output voltage control signal 412 from the delay circuit 410. When the output voltage control signal 412 is received after the predetermined delay from the first NMOS transistor 700 receiving the decoded row address signal 434 during the memory write operation, a parasitic capacitance $C_{DG}$ can be generated between the second drain electrode 714 and the second gate electrode 712. The parasitic capacitance $C_{DG}$ can raise the first gate voltage $V_{G1}$ to a second gate voltage $V_{G2}$ that is higher than the predefined supply voltage $V_{SUP}$. In this regard, the voltage generation circuit 404(1) becomes a voltage-boosting circuit that can drive the write voltage $V_W$ based on the boosted voltage of the second gate voltage $V_{G2}$. In a non-limiting example, the second gate voltage $V_{G2}$ is greater than the predefined supply voltage $V_{SUP}$ plus a second threshold voltage $V_{TN2}$ of the second NMOS transistor 702 ($V_{G2}>V_{SUP} V_{TN2}$). As a result of the second gate voltage $V_{G2}$ being raised above the predefined supply voltage $V_{SUP}$, the second NMOS transistor 702 can boost an output voltage on the second source electrode 716 to provide the write voltage $V_W$ to the selected word line 406(1). In a non-limiting example, the write voltage $V_W$ is greater than a difference between the predefined supply voltage $V_{SUP}$ and the second threshold voltage $V_{TN2}$ of the second NMOS transistor 702 ($V_W>V_{SUP}-V_{TN2}$). In another non-limiting example, the write voltage $V_W$ outputted on the second source electrode 716 can be substantially close to the predefined supply voltage $V_{SUP}$ ($V_W \approx V_{SUP}$).

FIG. 8A is a schematic diagram providing an exemplary illustration of the voltage generation circuit 404(1) of FIG. 7 configured to boost the write voltage $V_W$ for the memory write operation. As illustrated in FIG. 8A, when the voltage generation circuit 404(1) (not shown) receives the output voltage control signal 412 after a delay 800 greater than the predetermined delay from receiving the decoded row address signal 434, the parasitic capacitance $C_{DG}$ (not shown) causes the first gate voltage $V_{G1}$ to raise to the second gate voltage $V_{G2}$ higher than the predetermined supply voltage $V_{SUP}$. As a result, the write voltage $V_W$ is boosted above the of ($V_{SUPP}-Y_{TN2}$).

With reference back to FIG. 7, when the output voltage control signal 412 is received before the predetermined delay from the first NMOS transistor 700 receiving the decoded row address signal 434 during the memory read operation, the parasitic capacitance $C_{DG}$ may not exist between the second drain electrode 714 and the second gate electrode 712. As such, the first gate voltage $V_{G1}$ will not be raised to the second gate voltage $V_{G2}$. As a result, the second NMOS transistor 702 outputs the read voltage $Y_R$ lower than the predefined supply voltage $V_{SUP}$. In a non-limiting example, the read voltage $Y_R$ is less than or equal to a difference between the predefined supply voltage $V_{SUP}$, the first threshold voltage $V_{TN1}$, and the second threshold voltage $Y_{TN2}$ ($Y_R \leq V_{SUP}-Y_{TN1}-V_{TN2}$).

FIG. 8B is a schematic diagram providing an exemplary illustration of the voltage generation circuit 404(1) of FIG. 7 configured to generate the read voltage $Y_R$ lower than the predefined supply voltage $V_{SUP}$ for the memory read operation. As illustrated in FIG. 8B, when the voltage generation circuit 404(1) receives the output voltage control signal 412 after a delay 802 less than the predetermined delay from receiving the decoded row address signal 434, the first gate voltage $V_{G1}$ remains unchanged. As a result, the read voltage $Y_R$ is lower than the predefined supply voltage $V_{SUPP}$.

With reference back to FIG. 7, the third NMOS transistor 704 includes a third gate electrode 718, a third drain electrode 720, and a third source electrode 722. The third drain electrode 720 is coupled to the second source electrode 716 of the second NMOS transistor 702. The third source electrode 722 is coupled to a ground 724. The third gate electrode 718 is configured to receive an inverted output voltage control signal 726 that is inverted from the output voltage control signal 412. In a non-limiting example, the third NMOS transistor 704 is configured to discharge a current (not shown) flowing from the second drain electrode 714 of the second NMOS transistor 702 to the third source electrode 722 of the third NMOS transistor 704 in the memory read operation.

Figure 9:
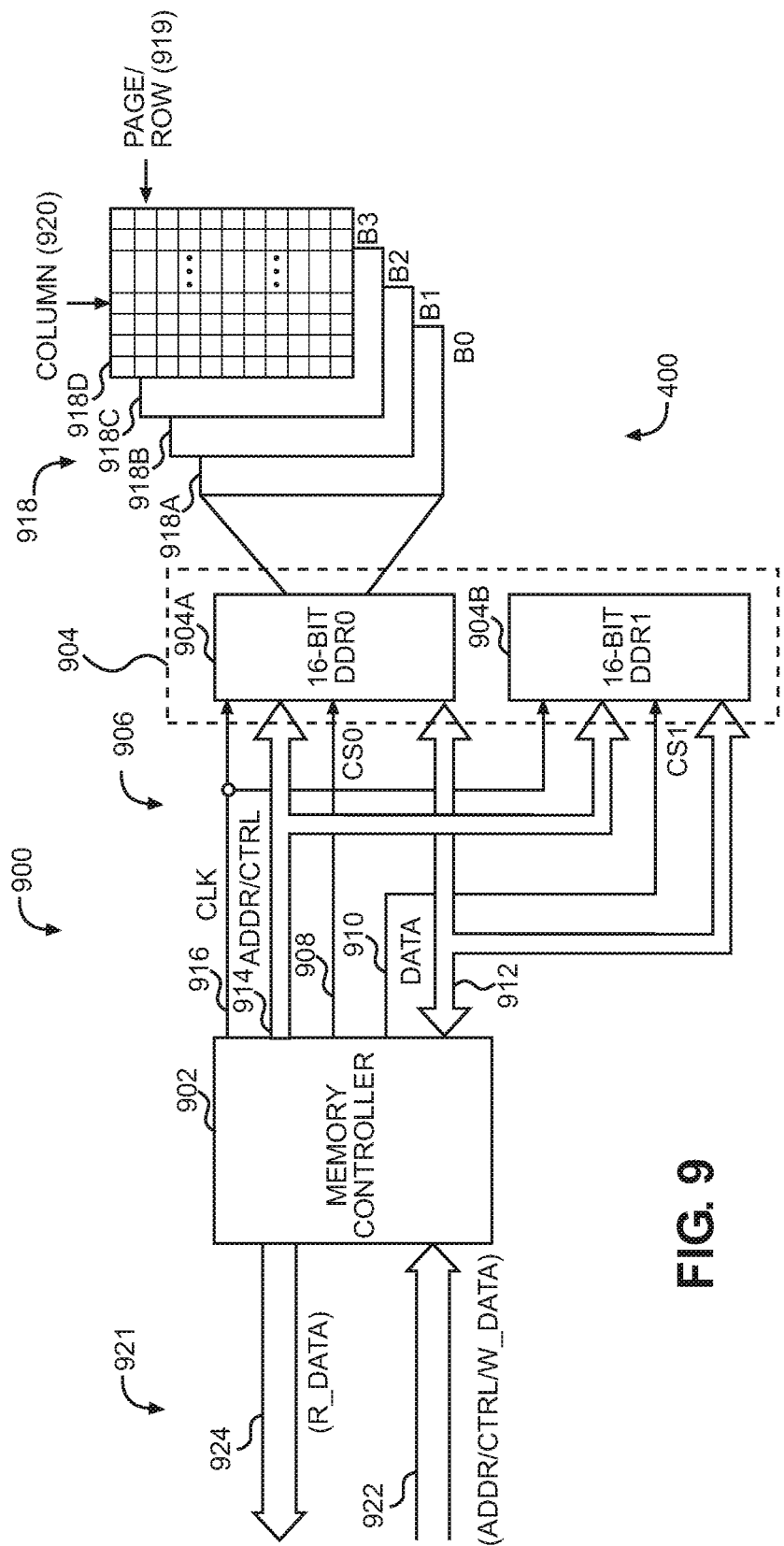
FIG. 9 is a diagram of an exemplary configurable memory controller and associated memory as part of an exemplary processor-based system that can include the word line voltage generation system of FIG. 4 configured to generate the boosted voltage for driving the write voltage to the selected word line(s) for the memory write operation to the memory array.

The word line voltage generation system 402 of FIG. 4 can be provided in a configurable memory controller and associated memory as part of an exemplary processor-based system. In this regard, FIG. 9 illustrates an exemplary memory system 900 that can include the word line voltage generation system 402 of FIG. 4 configured to generate the boosted voltage for driving the write voltage $V_W$ to the selected word line 406(1) for the memory write operation to the memory array 408. The memory system 900 employs a memory controller 902 configured to provide a separate memory access configuration for each memory bank in the memory system 900. The memory controller 902 is responsible for the flow of data going to and from memory 904. In the illustrated example, the memory controller 902 is responsible for controlling the flow of data to and from two dynamic memory chips 904A, 904B. In this example, each memory chip 904A, 904B is a 16-bit double data rate (DDR) dynamic random access memory (DRAM) chip, labeled DDR0 and DDR1. In this regard, the memory controller 902 used to drive two DDR DRAM memory chips 904A, 904B may be a DDR memory controller. DDR memory controllers may be more complicated than Single Data Rate (SDR) memory controllers, but they allow for twice the data to be transferred without increasing the clock rate or bus width to the memory cell. However, the memory chips 904A, 904B may be any type of dynamic memory. Examples include SDRAM, DDR, DDR2, DDR3, Mobile DDR (MDDR), Low Power DDR (LPDDR), and LPDDR2. The memory controller 902 may be any type of memory controller compatible with its memory chips. Further, the memory controller 902 as illustrated may be provided on a motherboard or other printed circuit board (PCB) as a separate device, or integrated on at least one central processing unit (CPU) or semiconductor die, which may reduce memory latency.

The memory controller 902 controls the flow of data to and from the memory chips 904A, 904B via a memory bus 906. In this example, the memory bus 906 includes two chip selects (CS0, CS1) 908, 910; one for each memory chip 904A, 904B. The chip selects 908, 910 are selectively enabled by the memory controller 902 to enable the memory chip 904A, 904B containing the desired memory location to be accessed. The memory controller 902 only enables one of the memory chips 904A. 904B at a time so that only one DDR DRAM memory chip 904A, 904B asserts data on a data (DATA) bus 912 at one Lime to avoid data collisions. The memory bus 906 also includes an address/control (ADDR/CTRL) bus 914 that allows the memory controller 902 to control the memory address accessed in the memory chips 904A, 904B for either writing or reading data to or from the memory 904. The memory bus 906 also includes a clock signal (CLK) 916 to synchronize timing between the memory controller 902 and the memory chips 904A, 904B for memory accesses. In this example, data is transferred on the rising and falling access of the clock signal (CLK) 916 of the memory system 900 for the DDR DRAM memory chip 904A, 904B.

Each DDR DRAM memory chip 904A, 904B contains a plurality of memory banks, referred to generally as element 918. A memory bank is a logical unit of memory, the size of which is determined by the CPU of a system. In the illustrated example of FIG. 9, the DDR DRAM memory chips 904A, 904B are 16-bit memory chips designed for use with a 16-bit CPU, requiring the memory banks 918 to provide 16 bits of information at one time. In the illustrated example, each DDR DRAM memory chip 904A, 904B contains four memory banks. Only the four memory banks (B0, B1, B2, and B3) 918A, 918B, 918C, 918D for DDR DRAM memory chip (DDR0) 904A are illustrated in FIG. 9; however, the DDR DRAM memory chip (DDR1) 904B also contains similar memory banks and memory pages. Thus, a memory bank and memory page are referred to herein generally for each DDR DRAM memory chip 904A, 904B as elements 918 and 919, respectively.

Each memory bank 918 is organized into a grid-like pattern, with "rows" and "columns." The data stored in the DDR DRAM memory chips 904A, 904B comes in blocks, defined by the coordinates of the row and column of the specific information. Each row is known as a memory page 919. In order to access the memory 904 in the DDR DRAM memory chips 904A, 904B, the memory controller 902 asserts a chip select (CS0 or CS1) 908, 910, and issues a memory page open command that activates a certain memory page 919 as indicated by the address on the ADDR/CTRL bus 914. This command typically takes a few clock cycles. After the desired memory page 919 is opened, a column address 920, as either a "read" or "write," is issued by the memory controller 902 to access the data in the desired memory location. When an access is requested to another memory page 919 in the memory bank 918, the memory controller 902 has to deactivate or close the currently activated memory page 919, which typically takes a few clock cycles. Hence, memory access to the data in the memory chips 904A, 904B normally involves opening the memory page 919 containing the desired memory location for writing or reading data, and then closing the memory page 919 after the memory access is completed. In this manner, a different memory page 919 can subsequently be accessed by the memory controller 902.

If contiguous memory accesses are made to the same memory page 919 in a given memory bank 918, clock cycles could be saved if the memory page 919 was kept open after the first memory access. In this manner, the subsequent memory access to the same memory page 919 would not require reopening the memory page 919. The amount of total clock cycle savings depends on the number of contiguous memory accesses to the same memory page 919. However, if memory accesses are often made to different memory pages 919, keeping or leaving a memory page 919 open after an access can result in clock cycle penalties. This is because before the memory page 919 of subsequent memory access can be opened, the memory controller 902 would first have to close the memory page 919 that was previously left open. The amount of clock cycle penalties depends on the number of contiguous memory accesses to different memory pages 919.

According to aspects described herein, the memory controller 902 is configurable to provide memory access configurations for each of the memory banks 918 individually. A memory access configuration is a configuration stored in or accessible to the memory controller 902 to indicate whether memory pages 919 accessed from a particular memory bank 918 are to be left open or closed after an access. In this regard, an overall memory access time savings for the memory system 900 can be realized over memory systems that do not allow for a memory access configuration for each memory bank 918. For example, the DDR DRAM memory chip 904A in the memory system 900 of FIG. 9 may be designed to store system data in its memory banks 918 that typically involve random memory accesses where contiguous memory access often does not involve accesses to memory locations in the same memory pages 919. Examples include CPU system memory, including cache accesses. In this scenario, providing a memory access configuration for the memory banks 918 of the DDR DRAM memory chip 904A to close a memory page 919 after each access will prevent memory access penalties that result from the memory controller 902 having to first close a previously accessed memory page 919 before a new memory page 919 in a given memory bank 918 can be accessed. On the other hand, the DDR DRAM memory chip 904B may be designed to store application or other types of data, such as video, graphics, or display based data, where the same memory pages 919 are often accessed contiguously. In this scenario, providing a memory access configuration for the memory banks 918 of the DDR DRAM memory chip 904B to leave its memory pages 919 open after each access will result in memory access time savings. This is because the contiguous memory accesses to the same memory page 919 will not require the memory page 919 to be opened for each access.

Once the desired memory location is accessed over the memory bus 906, the memory controller 902 can provide the accessed data to a system bus 921. In the illustrated example, the system bus 921 is a different bus from the memory bus 906. However, in other systems, the memory bus 906 and the system bus 921 could be the same bus. The accessed data is provided by the memory controller 902 over the system bus 921 to another component in a processor-based system. In the illustrated example of FIG. 9, the system bus 921 includes an address/control/write data (ADDR/CTRL/W_DATA) bus 922 that receives the address of the memory location to be accessed as well as any data to be written to the memory 904. A read data (R_DATA) bus 924 is also provided to carry data read from the memory 904. The memory controller 902 asserts data from a read memory location in the memory 904 onto the R_DATA bus 924.

A voltage self-boosting circuit for generating a boosted voltage for driving a word line write in a memory array for a memory write operation according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
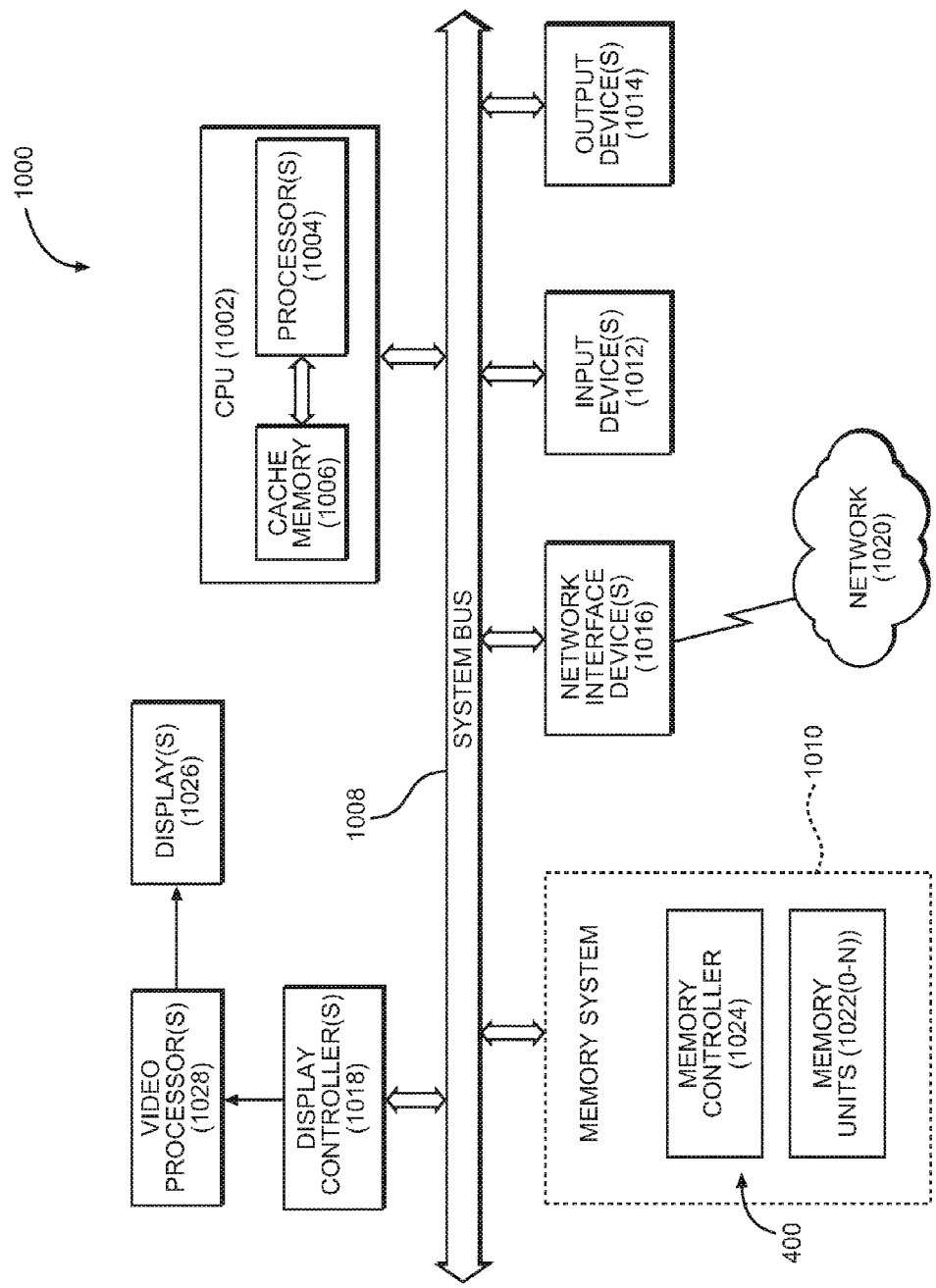
FIG. 10 is a block diagram of an exemplary processor-based system that can include a memory system, including but not limited to the memory system of FIG. 4, in which the word line voltage generation system is configured to generate the boosted voltage for driving the write voltage to the selected word line(s) for the memory write operation to the memory array.

In this regard, FIG. 10 illustrates an example of a processor-based system 1000 that can include a memory system, including but not limited to the memory system 400 of FIG. 4, in which the word line voltage generation system 402 is configured to generate the boosted voltage for driving the write voltage $V_W$ to the selected word line 406(1) for the memory write operation to the memory array 408. In this example, the processor-based system 1000 includes one or more CPUs 1002, each including one or more processors 1004. The CPU(s) 1002 may have cache memory 1006 coupled to the processor(s) 1004 for rapid access to temporarily stored data. The CPU(s) 1002 is coupled to a system bus 1008. As is well known, the CPU(s) 1002 communicates with other devices by exchanging address, control, and data information over the system bus 1008. Although not illustrated in FIG. 10, multiple system buses 1008 could be provided, wherein each system bus 1008 constitutes a different fabric.

Other master and slave devices can be connected to the system bus 1008. As illustrated in FIG. 10, these devices can include a memory system 1010, such as the memory system 400 of FIG. 4, one or more input devices 1012, one or more output devices 1014, one or more network interface devices 1016, and one or more display controllers 1018, as examples. The input device(s) 1012 can include any type of input device, including, but not limited to, input keys, switches, voice processors, etc. The output device(s) 1014 can include any type of output device, including, but not limited to, audio, video, other visual indicators, etc. The network interface device(s) 1016 can be any device configured to allow exchange of data to and from a network 1020. The network 1020 can be any type of network, including, but not limited to, a wired or wireless network, a private or public network, a local area network (LAN), a wireless local area network (WLAN), a wide area network (WAN), a BLUETOOTH™ network, or the Internet. The network interface device(s) 1016 can be configured to support any type of communications protocol desired. The memory system 1010 can include one or more memory units 1022 (0-N) and a memory controller 1024.

The CPU(s) 1002 may also be configured to access the display controller(s) 1018 over the system bus 1008 to control information sent to one or more displays 1026. The display controller(s) 1018 sends information to the display(s) 1026 to be displayed via one or more video processors 1028, which process the information to be displayed into a format suitable for the display(s) 1026. The display(s) 1026 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A word line voltage generation system for driving a word line of a memory row in a memory array for memory accesses, comprising:
    a delay circuit configured to:
        receive a command signal indicating a memory read operation or a memory write operation for a memory access operation;
        receive a delay circuit enable signal in response to decoding a row address of a selected word line in the memory array for the memory read operation or the memory write operation;
        delay the delay circuit enable signal by a predetermined delay in response to the command signal indicating the memory write operation; and
        generate an output voltage control signal based on the delay circuit enable signal; and
    a voltage generation circuit configured to:
        receive a voltage supply signal corresponding to a predefined supply voltage;
        receive a decoded row address signal identifying the selected word line for the memory read operation or the memory write operation;
        receive the output voltage control signal from the delay circuit;
        generate a read voltage based on the predefined supply voltage on the selected word line in response to not receiving the output voltage control signal after receiving the decoded row address signal; and
        generate a write voltage higher than the read voltage based on the predefined supply voltage on the selected word line in response to receiving the output voltage control signal after receiving the decoded row address signal.

2. The word line voltage generation system of claim 1, wherein the delay circuit is configured to receive the delay circuit enable signal substantially concurrent with the voltage generation circuit receiving the decoded row address signal.

3. The word line voltage generation system of claim 1, wherein the voltage generation circuit is configured to:
    generate the read voltage based on the predefined supply voltage on the selected word line in response to not receiving the output voltage control signal after the predetermined delay from receiving the decoded row address signal; and
    generate the write voltage higher than the read voltage based on the predefined supply voltage on the selected word line in response to receiving the output voltage control signal after the predetermined delay from receiving the decoded row address signal.

4. The word line voltage generation system of claim 1, wherein:
    the delay circuit is configured to generate the output voltage control signal substantially concurrent to receiving the delay circuit enable signal in response to the command signal indicating the memory read operation; and
    the voltage generation circuit is configured to generate the read voltage based on the predefined supply voltage on the selected word line in response to receiving the output voltage control signal substantially concurrent to receiving the decoded row address signal.

5. The word line voltage generation system of claim 1, further comprising a row decoder coupled to the delay circuit and the voltage generation circuit, the row decoder configured to:
    receive the command signal indicating the memory read operation or the memory write operation;
    receive the row address of the selected word line in the memory array for the memory read operation or the memory write operation;
    generate the decoded row address signal identifying the selected word line based on the received row address; and
    provide the delay circuit enable signal and the decoded row address signal substantially concurrently to the delay circuit and the voltage generation circuit, respectively.

6. The word line voltage generation system of claim 5, wherein the delay circuit comprises:
    a first signal path comprising a first AND-based logic circuit configured to:
        receive the delay circuit enable signal from the row decoder;
        receive the command signal; and
        output a first output voltage control signal based on the delay circuit enable signal before the predetermined delay from receiving the delay circuit enable signal if the command signal indicates the memory read operation;
    a second signal path, comprising:
        one or more delay elements configured to receive the delay circuit enable signal from the row decoder;
        delay the delay circuit enable signal by the predetermined delay to generate a delayed delay circuit enable signal; and
        a second AND-based logic circuit coupled to the one or more delay elements, the second AND-based logic circuit configured to:
            receive the delayed delay circuit enable signal and the command signal; and
            output a second output voltage control signal based on the delayed delay circuit enable signal if the command signal indicates the memory write operation; and
    a third AND-based logic circuit coupled to the first AND-based logic circuit and the second AND-based logic circuit, the third AND-based logic circuit configured to output the first output voltage control signal or the second output voltage control signal as the output voltage control signal for the memory read operation or the memory write operation.

7. The word line voltage generation system of claim 5, wherein the voltage generation circuit comprises:

a first n-type metal-oxide semiconductor (NMOS) transistor having a first gate electrode, a first drain electrode, and a first source electrode, wherein:
  the first drain electrode is configured to receive the decoded row address signal from the row decoder;
  the first gate electrode is configured to receive the voltage supply signal corresponding to the predefined supply voltage; and
  the first source electrode is configured to output a first gate voltage substantially equal to a difference between the predefined supply voltage and a first threshold voltage of the first NMOS transistor; and
a second NMOS transistor having a second gate electrode, a second drain electrode, and a second source electrode, wherein:
  the second gate electrode is coupled to the first source electrode of the first NMOS transistor to receive the first gate voltage;
  the second drain electrode is configured to receive the output voltage control signal from the delay circuit; and
  the second source electrode is configured to provide the write voltage or the read voltage to the selected word line;
the second NMOS transistor configured to:
  raise the first gate voltage to a second gate voltage higher than the predefined supply voltage to provide the write voltage higher than a difference between the predefined supply voltage and a second threshold voltage of the second NMOS transistor in response to the second NMOS transistor receiving the output voltage control signal after the predetermined delay from the first NMOS transistor receiving the decoded row address signal; and
  maintain the first gate voltage to provide the read voltage less than or equal to a difference between the predefined supply voltage, the first threshold voltage of the first NMOS transistor, and the second threshold voltage of the second NMOS transistor in response to the second NMOS transistor receiving the output voltage control signal before the predetermined delay from the first NMOS transistor receiving the decoded row address signal.

8. The word line voltage generation system of claim 7, wherein the voltage generation circuit further comprises a third NMOS transistor comprising:
  a third drain electrode coupled to the second source electrode of the second NMOS transistor;
  a third source electrode coupled to a ground; and
  a third gate electrode configured to receive an inverted output voltage control signal that is inverted from the output voltage control signal;
  the third NMOS transistor configured to discharge a current flowing from the second drain electrode of the second NMOS transistor to the third source electrode of the third NMOS transistor in the memory read operation.

9. The word line voltage generation system of claim 1 integrated into an integrated circuit (IC).

10. The word line voltage generation system of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device (e.g., a smart watch, a health or fitness tracker, eyewear, etc.); a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

11. A method for driving a word line of a memory row in a memory array for memory accesses, comprising:
  receiving a command signal indicating a memory read operation or a memory write operation for a memory access operation;
  receiving a delay circuit enable signal in response to decoding a row address of a selected word line in the memory array for the memory read operation or the memory write operation;
  delaying the delay circuit enable signal by a predetermined delay in response to the command signal indicating the memory write operation;
  generating an output voltage control signal based on the delay circuit enable signal;
  receiving a voltage supply signal corresponding to a predefined supply voltage;
  receiving a decoded row address signal identifying the selected word line for the memory read operation or the memory write operation;
  receiving the output voltage control signal;
  generating a read voltage based on the predefined supply voltage on the selected word line in response to not receiving the output voltage control signal after receiving the decoded row address signal; and
  generating a write voltage higher than the read voltage based on the predefined supply voltage on the selected word line in response to receiving the output voltage control signal after receiving the decoded row address signal.

12. The method of claim 11, further comprising receiving the delay circuit enable signal substantially concurrent with receiving the decoded row address signal.

13. The method of claim 11, further comprising:
  generating the read voltage based on the predefined supply voltage on the selected word line in response to not receiving the output voltage control signal after the predetermined delay from receiving the decoded row address signal; and
  generating the write voltage higher than the read voltage based on the predefined supply voltage on the selected word line in response to receiving the output voltage control signal after the predetermined delay from receiving the decoded row address signal.

14. The method of claim 11, further comprising:
  generating the output voltage control signal substantially concurrent to receiving the delay circuit enable signal in response to the command signal indicating the memory read operation; and
  generating the read voltage based on the predefined supply voltage and driving the read voltage to the selected word line in response to receiving the output voltage control signal substantially concurrent to receiving the decoded row address signal.

15. The method of claim 11, further comprising:
  receiving the row address of the selected word line in the memory array for the memory read operation or the memory write operation; and generating the decoded row address signal identifying the selected word line based on the received row address.

16. A memory system, comprising:
a memory array comprising a plurality of memory bit cells organized into a plurality of rows respectively addressed by a plurality of word lines and a plurality of columns respectively addressed by a plurality of bit lines and a plurality of source lines; and
a word line voltage generation system, comprising:
 a delay circuit configured to:
  receive a command signal indicating a memory read operation or a memory write operation for a memory access operation;
  receive a delay circuit enable signal in response to decoding a row address of a selected word line among the plurality of word lines for the memory read operation or the memory write operation;
  delay the delay circuit enable signal by a predetermined delay in response to the command signal indicating the memory write operation; and
  generate an output voltage control signal based on the delay circuit enable signal; and
 a plurality of voltage generation circuits, each configured to:
  receive a voltage supply signal corresponding to a predefined supply voltage;
  receive a decoded row address signal identifying the selected word line for the memory read operation or the memory write operation;
  receive the output voltage control signal from the delay circuit;
  generate a read voltage based on the predefined supply voltage on the selected word line in response to not receiving the output voltage control signal after receiving the decoded row address signal; and
  generate a write voltage higher than the read voltage based on the predefined supply voltage on the selected word line in response to receiving the output voltage control signal after receiving the decoded row address signal.

17. The memory system of claim 16, wherein the delay circuit is configured to receive the delay circuit enable signal substantially concurrent with the plurality of voltage generation circuits receiving the decoded row address signal.

18. The memory system of claim 16, wherein a voltage generation circuit among the plurality of voltage generation circuits is configured to:
generate the read voltage based on the predefined supply voltage on the selected word line in response to not receiving the output voltage control signal after the predetermined delay from receiving the decoded row address signal; and
generate the write voltage higher than the read voltage based on the predefined supply voltage on the selected word line in response to receiving the output voltage control signal after the predetermined delay from receiving the decoded row address signal.

19. The memory system of claim 16, wherein:
the delay circuit is configured to generate the output voltage control signal substantially concurrent to receiving the delay circuit enable signal in response to the command signal indicating the memory read operation; and
a voltage generation circuit among the plurality of voltage generation circuits that is coupled to the selected word line is configured to generate the read voltage based on the predefined supply voltage on the selected word line in response to receiving the output voltage control signal substantially concurrent to receiving the decoded row address signal.

20. The memory system of claim 16, wherein the word line voltage generation system further comprises a row decoder coupled to the delay circuit and the plurality of voltage generation circuits, the row decoder configured to:
receive the command signal indicating the memory read operation or the memory write operation;
receive the row address of the selected word line in the memory array for the memory read operation or the memory write operation;
generate the decoded row address signal identifying the selected word line among the plurality of word lines based on the received row address; and
provide the delay circuit enable signal and the decoded row address signal substantially concurrently to the delay circuit and a voltage generation circuit among the plurality of voltage generation circuits that is coupled to the selected word line, respectively.

21. The memory system of claim 20, wherein the delay circuit comprises:
a first signal path comprising a first AND-based logic circuit configured to:
 receive the delay circuit enable signal from the row decoder;
 receive the command signal; and
 output a first output voltage control signal based on the delay circuit enable signal before the predetermined delay from receiving the delay circuit enable signal if the command signal indicates the memory read operation;
a second signal path, comprising:
 one or more delay elements configured to receive the delay circuit enable signal from the row decoder;
 delay the delay circuit enable signal by the predetermined delay to generate a delayed delay circuit enable signal; and
 a second AND-based logic circuit coupled to the one or more delay elements, the second AND-based logic circuit configured to:
  receive the delayed delay circuit enable signal and the command signal; and
  output a second output voltage control signal based on the delayed delay circuit enable signal if the command signal indicates the memory write operation; and
a third AND-based logic circuit coupled to the first AND-based logic circuit and the second AND-based logic circuit, the third AND-based logic circuit configured to output the first output voltage control signal or the second output voltage control signal as the output voltage control signal for the memory read operation or the memory write operation.

22. The memory system of claim 20, wherein each of the plurality of voltage generation circuits comprises:
a first n-type metal-oxide semiconductor (NMOS) transistor having a first gate electrode, a first drain electrode, and a first source electrode, wherein:
 the first drain electrode is configured to receive the decoded row address signal from the row decoder;
 the first gate electrode is configured to receive the voltage supply signal corresponding to the predefined supply voltage; and
 the first source electrode is configured to output a first gate voltage substantially equal to a difference between the predefined supply voltage and a first threshold voltage of the first NMOS transistor; and a second NMOS transistor having a second gate electrode, a second drain electrode, and a second source electrode, wherein:

the second gate electrode is coupled to the first source electrode of the first NMOS transistor to receive the first gate voltage;

the second drain electrode is configured to receive the output voltage control signal from the delay circuit; and the second source electrode is configured to provide the write voltage or the read voltage to the selected word line among the plurality of word lines;

the second NMOS transistor configured to:

raise the first gate voltage to a second gate voltage higher than the predefined supply voltage to provide the write voltage higher than a difference between the predefined supply voltage and a second threshold voltage of the second NMOS transistor in response to the second NMOS transistor receiving the output voltage control signal after the predetermined delay from the first NMOS transistor receiving the decoded row address signal; and maintain the first gate voltage to provide the read voltage lower than or equal to a difference between the predefined supply voltage, the first threshold voltage of the first NMOs transistor, and the second threshold voltage of the second NMOS transistor in response to the second NMOS transistor receiving the output voltage control signal before the predetermined delay from the first NMOS transistor receiving the decoded row address signal.

23. The memory system of claim 22, wherein each of the plurality of voltage generation circuits further comprises a third NMOS transistor comprising:

a third drain electrode coupled to the second source electrode of the second NMOS transistor;

a third source electrode coupled to a ground; and a third gate electrode configured to receive an inverted output voltage control signal that is inverted from the output voltage control signal;

the third NMOS transistor configured to discharge a current flowing from the second drain electrode of the second NMOS transistor to the third source electrode of the third NMOS transistor in the memory read operation.

* * * * *